(12) United States Patent
Chen

(10) Patent No.: US 12,009,823 B2
(45) Date of Patent: Jun. 11, 2024

(54) PULSE WIDTH MODULATION METHOD

(71) Applicant: RICHTEK TECHNOLOGY CORPORATION, Hsinchu (TW)

(72) Inventor: Yi-Kuang Chen, Taichung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 107 days.

(21) Appl. No.: 18/049,611

(22) Filed: Oct. 25, 2022

(65) Prior Publication Data

US 2023/0188120 A1 Jun. 15, 2023

Related U.S. Application Data

(60) Provisional application No. 63/289,304, filed on Dec. 14, 2021.

(30) Foreign Application Priority Data

Jun. 9, 2022 (TW) .................................. 111121433

(51) Int. Cl.
*H03K 3/017* (2006.01)
*H03K 3/023* (2006.01)

(52) U.S. Cl.
CPC ............. *H03K 3/017* (2013.01); *H03K 3/023* (2013.01)

(58) Field of Classification Search
CPC .......... H03K 3/017; H03K 3/023; H03K 7/08; H03K 5/084
USPC .................................................... 327/172–175
See application file for complete search history.

(56) References Cited

U.S. PATENT DOCUMENTS 11,290,070 B2 * 3/2022 Zanbaghi .............. H03F 3/2173
2010/0007395 A1 * 1/2010 Sugie ..................... H03K 4/502
327/178

* cited by examiner

*Primary Examiner* — Ryan Johnson
*Assistant Examiner* — Colleen J O Toole
(74) *Attorney, Agent, or Firm* — Tung & Associates

(57) ABSTRACT

A pulse width modulation (PWM) method for converting an input signal into an output PWM signal includes the following steps: generating a first linear periodic wave and a second linear periodic wave which are triangle waves or sawtooth waves, wherein the amplitude of the first linear periodic wave is greater than the amplitude of the second linear periodic wave; determining whether the level of the input signal is lower than a light load threshold; when the level of the input signal is lower than the light load threshold, generating the output PWM signal according to a comparison between the input signal and the second linear periodic wave; and when the level of the input signal is higher than the light load threshold, generating the output PWM signal according to a comparison between the input signal and the first linear periodic wave.

13 Claims, 14 Drawing Sheets

PULSE WIDTH MODULATION METHOD

CROSS REFERENCE

The present invention claims priority to U.S. 63/289,304 filed on Dec. 14, 2021 and claims priority to TW 111121433 filed on Jun. 9, 2022.

BACKGROUND OF THE INVENTION

Field of Invention

The present invention relates to a modulation method, in particular to a pulse width modulation method.

Description of Related Art

Please refer to FIG. 1. FIG. 1 is a waveform diagram of a multilevel pulse width modulation (Multilevel PWM) signal in a conventional art. As shown in FIG. 1, the waveform W1 is an input signal, and the waveform W2 is the multilevel PWM signal of the conventional art, wherein the waveform W2 is generated according to the waveform W1. The multi-level PWM signal of the conventional art has three characteristics, which are: that the signal in each level range has the same amplitude; that the duty cycle of the signal is 50% during idle condition, and the switching frequency of the signal is a constant value, wherein the idle condition of the signal is when the level of the input signal is zero. However, these three characteristics cause the multi-level PWM signals of the conventional art to have a number of disadvantages.

First, the multilevel PWM signal is filtered by a filter inductor and a filter capacitor before being supplied to a load. Because the multilevel PWM signal in the conventional art has the same amplitude in different level ranges and the amplitude cannot be adaptively reduced under light load condition, the light load condition will suffer larger ripple current, resulting in a larger conduction loss. On the other hand, under heavy load condition, the multilevel PWM signal of the conventional art cannot increase its amplitude adaptively, so its on-current is high, which results in high conduction loss. In addition, the duty cycle of the multi-level PWM signal in the conventional art is 50% during idle condition, which produces a larger idle condition current and causes a larger power consumption. Furthermore, the switching frequency of the multilevel PWM signal of the conventional art is a constant value and cannot be adjusted adaptively, and this also contributes to generating a larger ripple current at light load condition, resulting in a larger power consumption. The aforementioned heavy load, light load, and idle condition refer to states wherein the amplitude of the input signal or the absolute value of an alternating current (AC) level (in particular voltage level) thereof is relatively high, relatively low, and zero, respectively.

In view of the above, to overcome the drawbacks of the above-mentioned conventional art, the present invention proposes a PWM method to adaptively generate an output PWM signal, so as to improve the power conversion efficiency of the output PWM signal under light load, heavy load, and idle conditions.

SUMMARY OF THE INVENTION

From one perspective, the present invention provides a pulse width modulation (PWM) method, which is configured to convert an input signal into a corresponding output PWM signal, the PWM method comprising: generating a first linear periodic wave and a second linear periodic wave, wherein an amplitude of the first linear periodic wave is greater than an amplitude of the second linear periodic wave, wherein each of the first linear periodic wave and the second linear periodic wave is a triangular wave or a sawtooth wave; determining whether a level of the input signal is less than a light load threshold, when the level of the input signal is less than the light load threshold, generating the output PWM signal according to a comparison between the input signal and the second linear periodic wave; and when the level of the input signal is greater than the light load threshold, generating the output PWM signal according to a comparison between the input signal and the first linear periodic wave; wherein there is a common mode non-zero offset between a common mode level of the second linear periodic wave and a common mode level of the input signal, so that a root mean square (RMS) power of the output PWM signal when the level of the input signal is less than the light load threshold is less than a RMS power of the output PWM signal when the common mode offset is zero.

In one embodiment, the PWM method further includes: comparing the input signal with the first linear periodic wave to generate a first relay PWM signal, and comparing the input signal with the second linear periodic wave to generate a second relay PWM signal; when the level of the input signal is less than the light load threshold, generating the output PWM signal according to the second relay PWM signal; and when the level of the input signal is greater than the light load threshold, generating the output PWM signal according to the first relay PWM signal.

In one embodiment, the PWM method further includes: when the level of the input signal is greater than the light load threshold, selecting the first linear periodic wave as a selected linear periodic wave; when the level of the input signal is less than the light load threshold, selecting the second linear periodic wave as the selected linear periodic wave; and comparing the input signal with the selected linear periodic wave to generate a selection PWM signal, and generating the output PWM signal according to the selection PWM signal.

In one embodiment, when a value of the input signal is zero, a duty cycle of the output PWM signal is not 50%.

In one embodiment, a frequency of the second linear periodic wave is X times a frequency of the first linear periodic wave, wherein X is a rational number greater than or equal to one.

In one embodiment, X is a non-integer greater than one.

In one embodiment, a predetermined phase difference other than zero exists between the first linear periodic wave and the second linear periodic wave.

In one embodiment, the predetermined phase difference is a product of 2n multiplied by a rational number.

In one embodiment, the amplitude of the first linear periodic wave is Y times the amplitude of the second linear periodic wave, wherein Y is a non-integer greater than one.

In one embodiment, the amplitude of the output PWM signal while the level of the input signal is greater than the light load threshold is greater than the amplitude of the output PWM signal while the level of the input signal is less than the light load threshold.

In one embodiment, the PWM method is configured to control a power stage circuit to generate the output PWM signal, wherein the power stage circuit comprises a plurality of switches, and the plurality of switches comprises a first switch, a second switch, and a third switch, the first switch being coupled between a light load supply voltage and a switching node; the second switch being coupled between a heavy load supply voltage and the switching node; and the third switch being coupled between the switching node and a ground potential, wherein the heavy load supply voltage is greater than the light load supply voltage; wherein when the level of the input signal is less than the light load threshold, the power stage circuit controls the first switch and the third switch to periodically switch complementarily to generate the output PWM signal at the switching node according to the comparison between the input signal and the second linear periodic wave, wherein the output PWM signal is switched between the light load supply voltage and the ground potential; and when the level of the input signal is greater than the light load threshold, the power stage circuit controls the second switch and the third switch to periodically switch complementarily to generate the output PWM signal at the switching node according to according to the comparison between the input signal and the first linear periodic wave, wherein the output PWM signal is switched between the heavy load supply voltage and the ground potential.

In one embodiment, the amplitude of the output PWM signal while the level of the input signal is greater than the light load threshold is Z times the amplitude of the output PWM signal while the level of the input signal is less than the light load threshold, wherein Z is a non-integer greater than one.

In one embodiment, the step of determining whether the level of the input signal is less than the light load threshold comprises: comparing an offset linear periodic wave with the input signal to generate an offset PWM signal, wherein the offset linear periodic wave is obtained by superimposing the first linear periodic wave with a common mode offset that is not zero, the common mode offset that is not zero is relevant to the light load threshold; and according to an operation period of the offset linear periodic wave, periodically determining whether an in-phase sub-signal of the offset PWM signal and an inverted-phase sub-signal of the offset PWM signal both have a pulse in a previous operation period, and determining whether the level of the input signal is less than the light load threshold; wherein the in-phase sub-signal of the input signal and the inverted-phase sub-signal of the input signal are complementary to each other, the in-phase sub-signal of the offset PWM signal being obtained by comparing the offset linear periodic wave with the in-phase sub-signal of the input signal, and the inverted-phase sub-signal of the offset PWM signal being obtained by comparing the offset linear periodic wave with the inverted-phase sub-signal of the input signal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
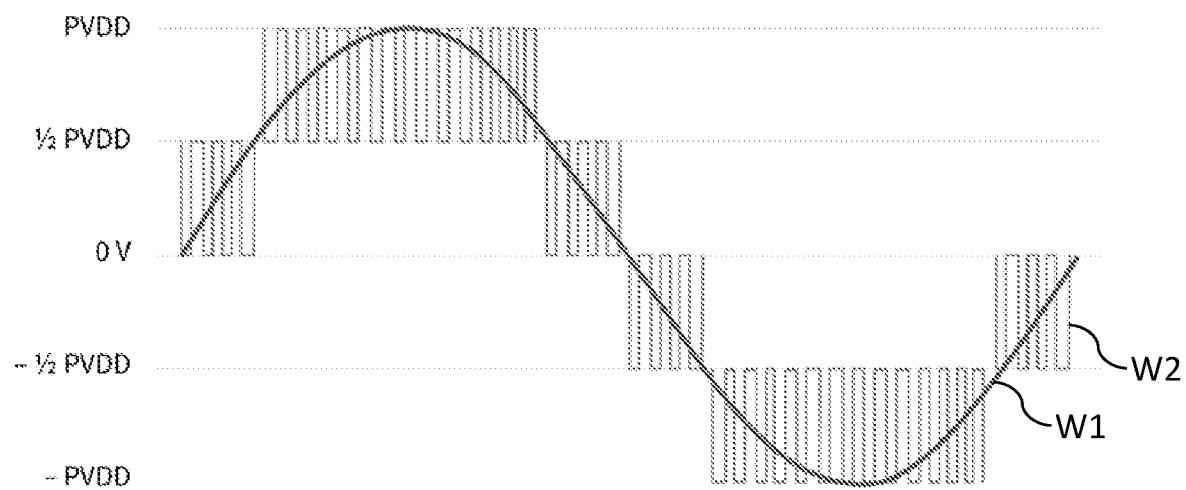
FIG. 1 is a waveform diagram of a multilevel pulse width modulation (PWM) signal according to a conventional art.
Figure 2:
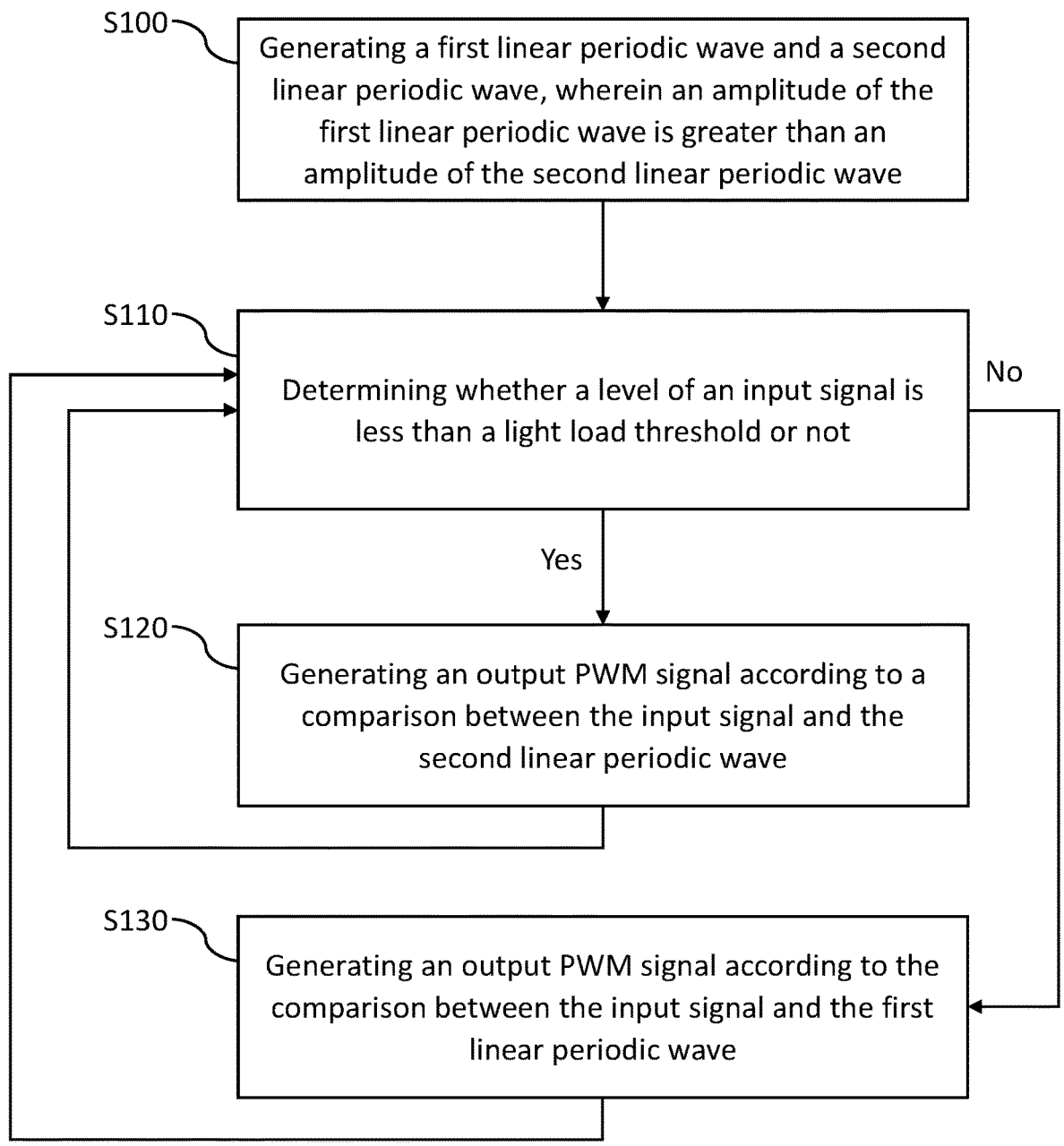
FIG. 2 is a flowchart of a PWM method according to an embodiment of the present invention.

Please refer to FIG. 2, which is a flowchart of a pulse width modulation (PWM) method according to an embodiment of the present invention. As shown in FIG. 2, the PWM method includes the following steps. First, a first linear periodic wave and a second linear periodic wave are generated, wherein an amplitude of the first linear periodic wave is greater than an amplitude of the second linear periodic wave, and each of the first linear periodic wave and the second linear periodic wave is a triangular wave or a sawtooth wave (step S100). Next step is: determining whether a level of an input signal is less than a light load threshold or not (step S110). When the level of the input signal is less than the light load threshold, an output PWM signal is generated according to a comparison between the input signal and the second linear periodic wave (step S120). When the signal level is greater than the light load threshold, an output PWM signal is generated according to a comparison between the input signal and the first linear periodic wave (step S130), wherein there is a common mode non-zero offset between a common mode level of the second linear periodic wave and a common mode level of the input signal, so that a root mean square (RMS) power of the output PWM signal when the level of the input signal is less than the light load threshold is less than a RMS power of the output PWM signal when the common mode offset is zero.

In describing that "the level of the input signal is less than a light load threshold", when the input signal is an alternating current (AC) signal, the level of the input signal refers to the absolute value of the AC level of the input signal. In addition, "light load" not only indicates that the level of the input signal is lower to an extent, but also can indicate that the power of the input signal or the power of the output signal is lower to an extent.

Figure 3A:
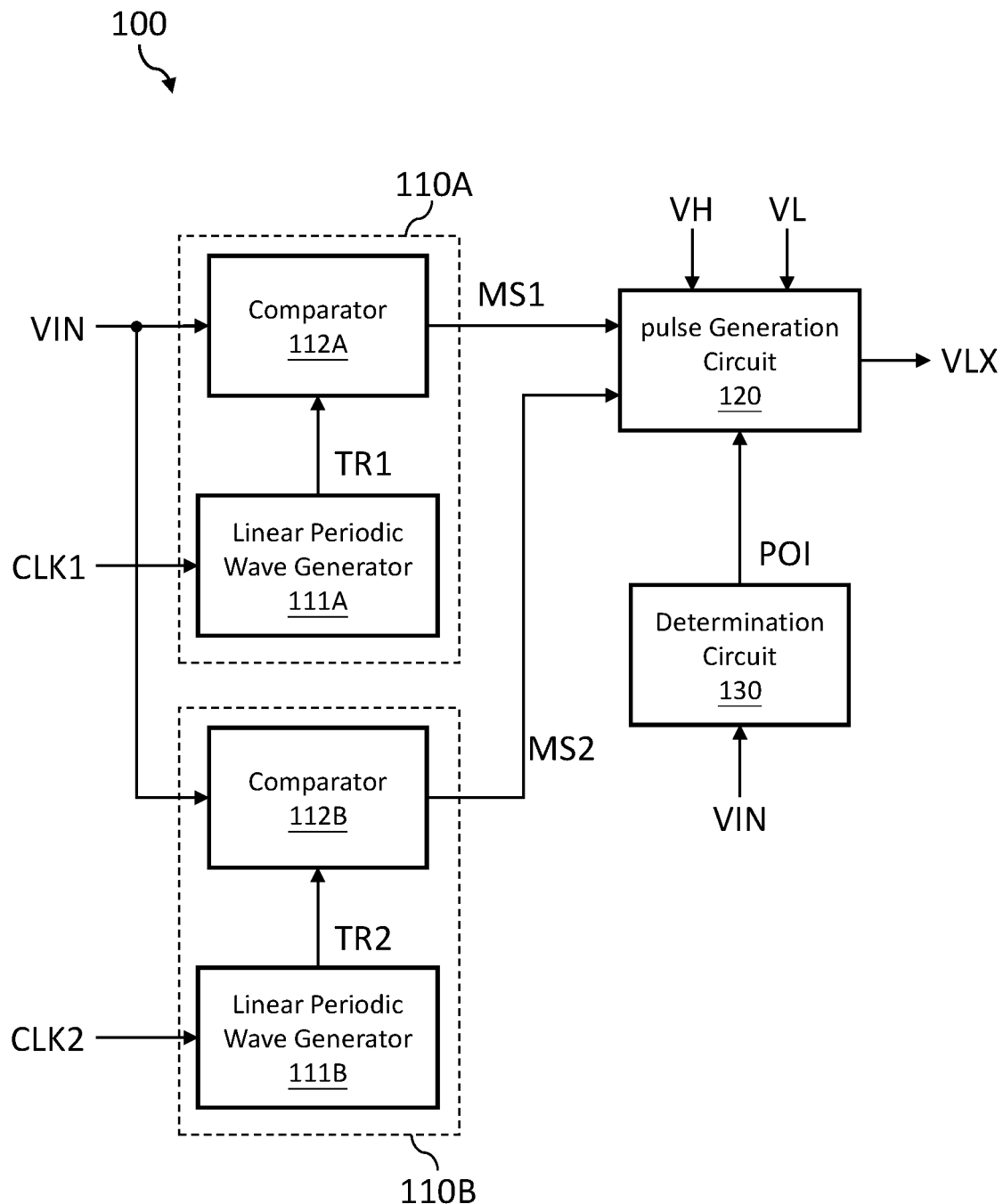
FIG. 3A is a modular block diagram of a class-D amplifier according to an embodiment of the present invention.

In some embodiments, a class-D amplifier can implement the flow of the PWM method. Please refer to FIG. 3A, which is a modular block diagram of a class-D amplifier 100 according to an embodiment of the present invention. As shown in FIG. 3A, the class-D amplifier 100 includes plural PWM circuits 110A and 110B, a pulse generation circuit 120, and a determination circuit 130, wherein the pulse generation circuit 120 is coupled to the PWM circuits 110A and 110B, and the determination circuit 130. The structures and functions of the PWM circuits 110A and 110B, the pulse generation circuit 120, and the determination circuit 130 will be explained in detail below.

In some embodiments, the PWM circuit 110A is configured to generate a first relay PWM signal MS1 according to an input signal VIN and a first linear periodic wave TR1. The PWM circuit 110B is configured to generate a second relay PWM signal MS2 according to the input signal VIN and a second linear periodic wave TR2. When the value of the input signal VIN is greater than the value of the first linear periodic wave TR1 (or the value of the input signal VIN is greater than the value of the second linear periodic wave TR2), the first relay PWM signal MS1 (or the second relay PWM signal MS2) is in a first state, such as a high potential state, and when the value of the input signal VIN is less than the value of the first linear periodic wave TR1 (or the value of the input signal VIN is less than the value of the second linear periodic wave TR2), the first relay PWM signal MS1 (or the second relay PWM signal MS2) is in a second state, such as a low potential state.

In some embodiments, the PWM circuit 110A includes a linear periodic wave generator 111A and a comparator 112A, and the PWM circuit 110B includes a linear periodic wave generator 111B and a comparator 112B, wherein the linear periodic wave generator 111A is configured to generate the first linear periodic wave TR1 according to a first clock signal CLK1, and the linear periodic wave generator 111B is configured to generate the second linear periodic wave according to a second clock signal CLK2 wave TR2. The comparator 112A is configured to compare the input signal VIN and the first linear periodic wave TR1 to generate the first relay PWM signal MS1, and the comparator 112B is configured to compare the input signal VIN and the second linear periodic wave TR2 to generate the second relay the PWM signal MS2. In some embodiments, each of the linear periodic wave generators 111A and 111B is a triangular wave generator or a sawtooth wave generator, and each of the first linear periodic wave TR1 and the second linear periodic wave TR2 is a triangular wave or a sawtooth wave. The triangular wave generator, sawtooth wave generator, and comparators are well known circuits to those skilled in the art to which the present invention pertains, and thus they are not explained in detail here.

In some embodiments, the pulse generation circuit 120 is configured to generate an output PWM signal VLX according to a light load indication signal POI, a first relay PWM signal MS1, a second relay PWM signal MS2, a heavy load supply voltage VH, and a light load supply voltage VL. When the light load indication signal POI is in a disabled state, indicating that the input signal VIN is in a heavy load state, the pulse generation circuit 120 generates the output PWM signal VLX according to the first relay PWM signal MS1 and the heavy load supply voltage VH. When the light load indication signal POI is in an enabled state, indicating that the input signal VIN is in the light load state, the pulse generation circuit 120 generates the output PWM signal VLX according to the second relay PWM signal MS2 and the light load supply voltage VL. In some embodiments, the value of the heavy load supply voltage VH is greater than the value of the light load supply voltage VL.

In some embodiments, the determination circuit 130 is configured to determine whether the level of the input signal VIN is less than a light load threshold, wherein the determination circuit 130 generates the light load indication signal POI according to the input signal VIN and the light load threshold. When the level of the input signal VIN is less than the light load threshold, the light load indication signal POI is in the enabled state, which means that the input signal VIN is in a light load state. When the level of the input signal VIN is greater than the light load threshold, the light load indication signal POI is in the disabled state, which means that the input signal VIN is in a heavy load state.

Figure 3B:
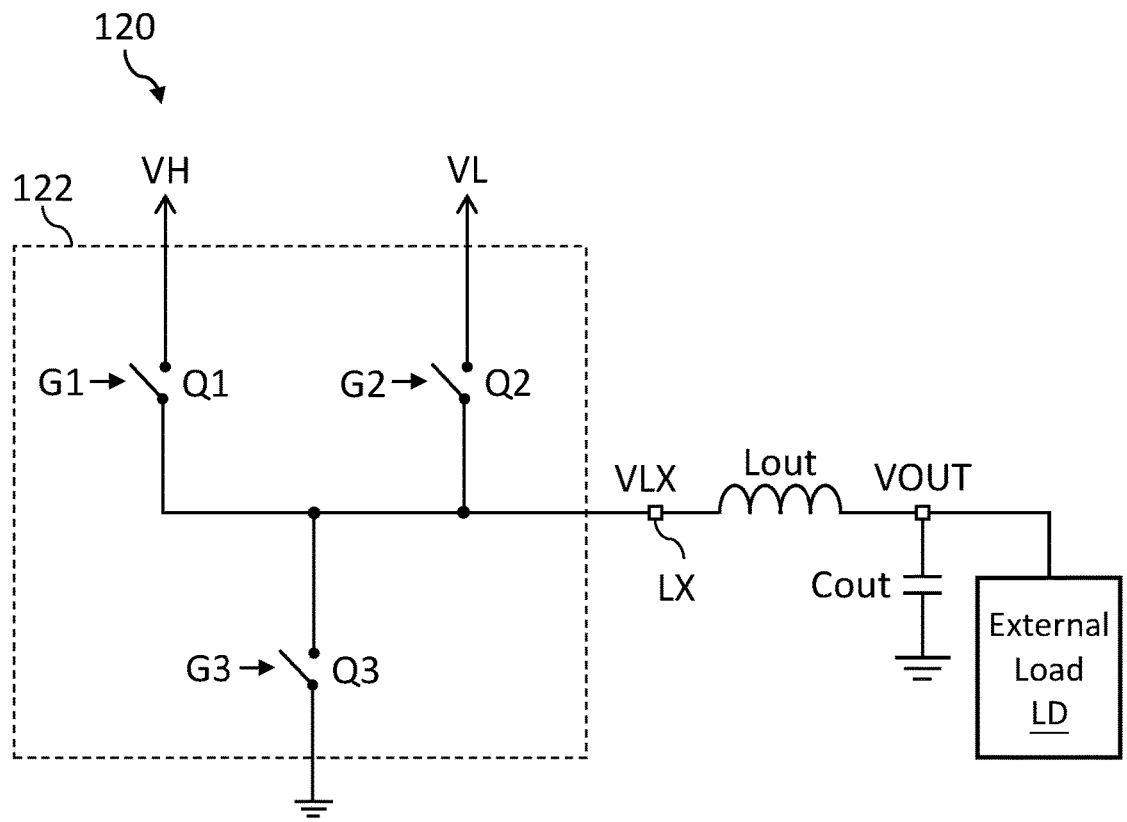
FIG. 3B is a schematic circuit diagram of a pulse generation circuit according to an embodiment of the present invention.
Figure 3B:
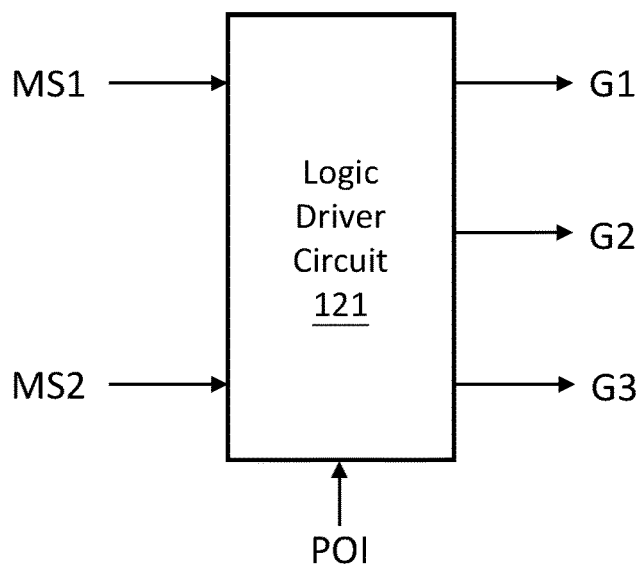

Please refer to FIG. 3B, which is a schematic circuit diagram of the pulse generation circuit 120 in an embodiment of the present invention. As shown in FIG. 3B, in some embodiments, the pulse generation circuit 120 includes a logic driver circuit 121 and a power stage circuit 122, wherein the logic driver circuit 121 is coupled to the power stage circuit 122. In some embodiments, the logic driver circuit 121 is configured to generate plural control signals G1-G3 according to the light load indication signal POI, the first relay PWM signal MS1, and the second relay PWM signal MS2, so as to control the operation of the power stage circuit 122. The power stage circuit 122 is configured to generate the output PWM signal VLX according to the control signals G1-G3. In some embodiments, the power stage circuit 122 is a Y-bridge circuit and the power stage circuit 122 includes plural switches Q1-Q3, wherein the control signal G1 is configured to control the switch Q1; the control signal G2 is configured to control the switch Q2; and the control signal G3 is configured to control the switch Q3. In this embodiment, the switch Q2 is coupled between the light load supply voltage VL and a switching node LX; the switch Q1 is coupled between the heavy load supply voltage VH and the switching node LX; and the switch Q3 is coupled between the switching node LX and a ground potential.

When the light load indication signal POI is in the disabled state, the logic driver circuit 121 generates the plural control signals G1-G3 according to the first relay PWM signal MS1, and the power stage circuit 122 controls the the switches Q1-Q3 according to the control signals G1-G3, respectively, so as to generate the output PWM signal VLX at the switching node LX, wherein the switch Q2 is always OFF, and the switch Q1 and the switch Q3 are periodically and complementarily switched between ON and OFF, whereby the amplitude of the output PWM signal is equal to the level of the heavy load supply voltage VH. When the light load indication signal POI is in the enabled state, the logic driver circuit 121 generates the plural control signals G1-G3 according to the second relay PWM signal MS2, and the power stage circuit 122 controls the switches Q1-Q3 according to the control signals G1-G3, respectively, so as to generate the output PWM signal VLX, wherein the switch Q1 is always OFF, and the switch Q2 and the switch Q3 are periodically and complementarily switched between ON and OFF, whereby the amplitude of the output PWM signal VLX is equal to the level of the light load supply voltage VL.

In some embodiments, the power stage circuit 122 is further coupled to an output inductor Lout, so that the output PWM signal VLX generated by the power stage circuit 122 is filtered by the output inductor Lout and the output capacitor Cout to generate an output signal VOUT, and the output signal VOUT is supplied to an external load LD.

Figure 4:
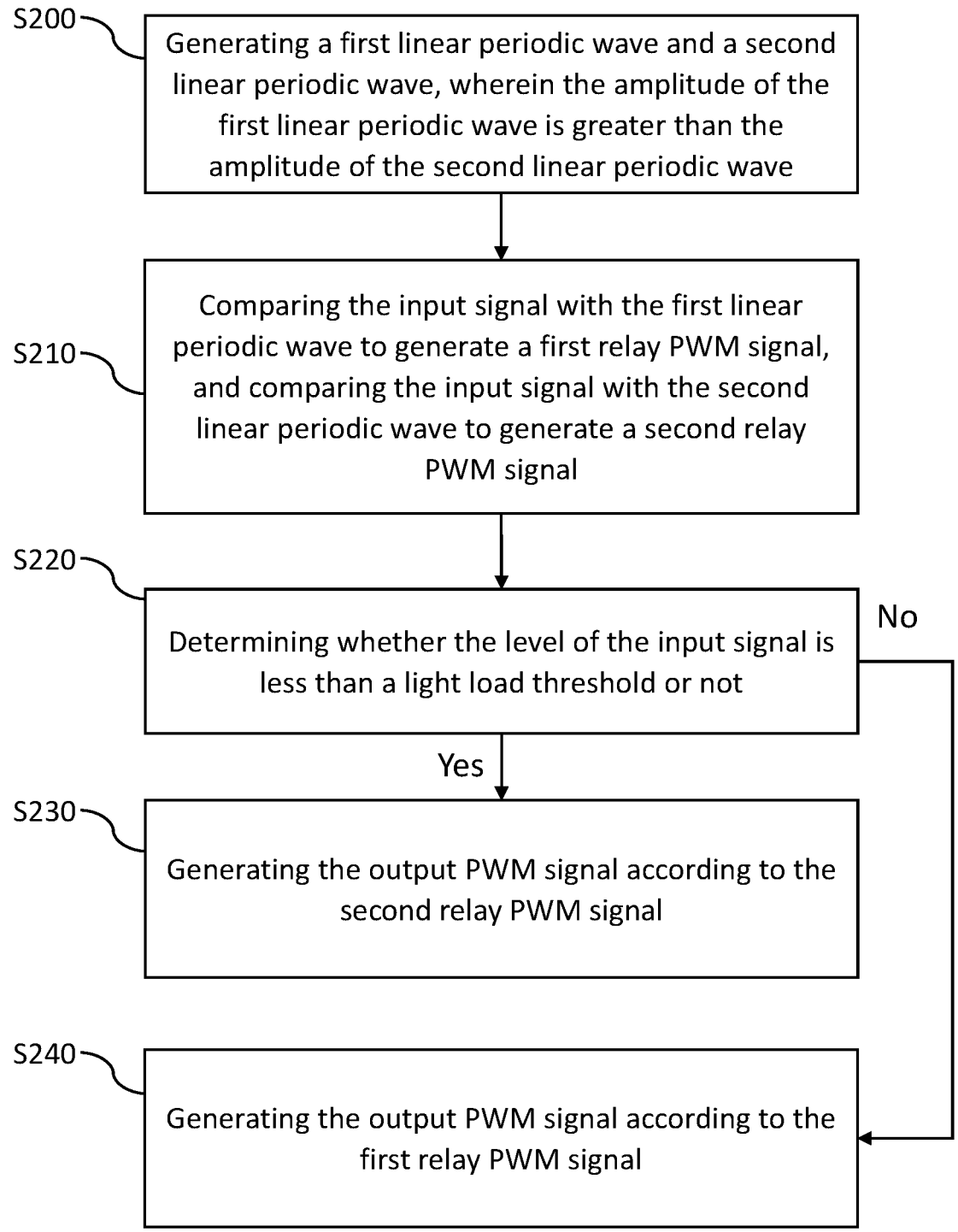
FIG. 4 is a flowchart of a class-D amplifier operating in a PWM method according to an embodiment of the present invention.

Please refer to FIG. 3A and FIG. 4. FIG. 4 is a flow chart of the class-D amplifier 100 operating in the PWM method according to an embodiment of the present invention. As shown in FIG. 4, first, the linear periodic wave generators 111A and 111B of the class-D amplifier 100 generate a first linear periodic wave TR1 and a second linear periodic wave TR2, respectively, wherein the amplitude of the first linear periodic wave TR1 is greater than the amplitude of the second linear periodic wave TR2 (step S200). Next, the comparator 112A of the class-D amplifier 100 compares the input signal VIN with the first linear periodic wave TR1 to generate a first relay PWM signal MS1, and the comparator 112B of the class-D amplifier 100 compares the input signal VIN with the second linear periodic wave TR2 to generate a second relay PWM signal MS2 (step S210). Subsequently, the determination circuit 130 of the class-D amplifier 100 determines whether the level of the input signal VIN is less than a light load threshold (step S220). If yes, the pulse generation circuit 120 of the class-D amplifier 100 will generate the output PWM signal VLX according to the second relay PWM signal MS2 (step S230); if not, the pulse generation circuit 120 of the class-D amplifier 100 will generate the output PWM signal VLX according to the first relay PWM signal MS1 (step S240).

Figure 5A:
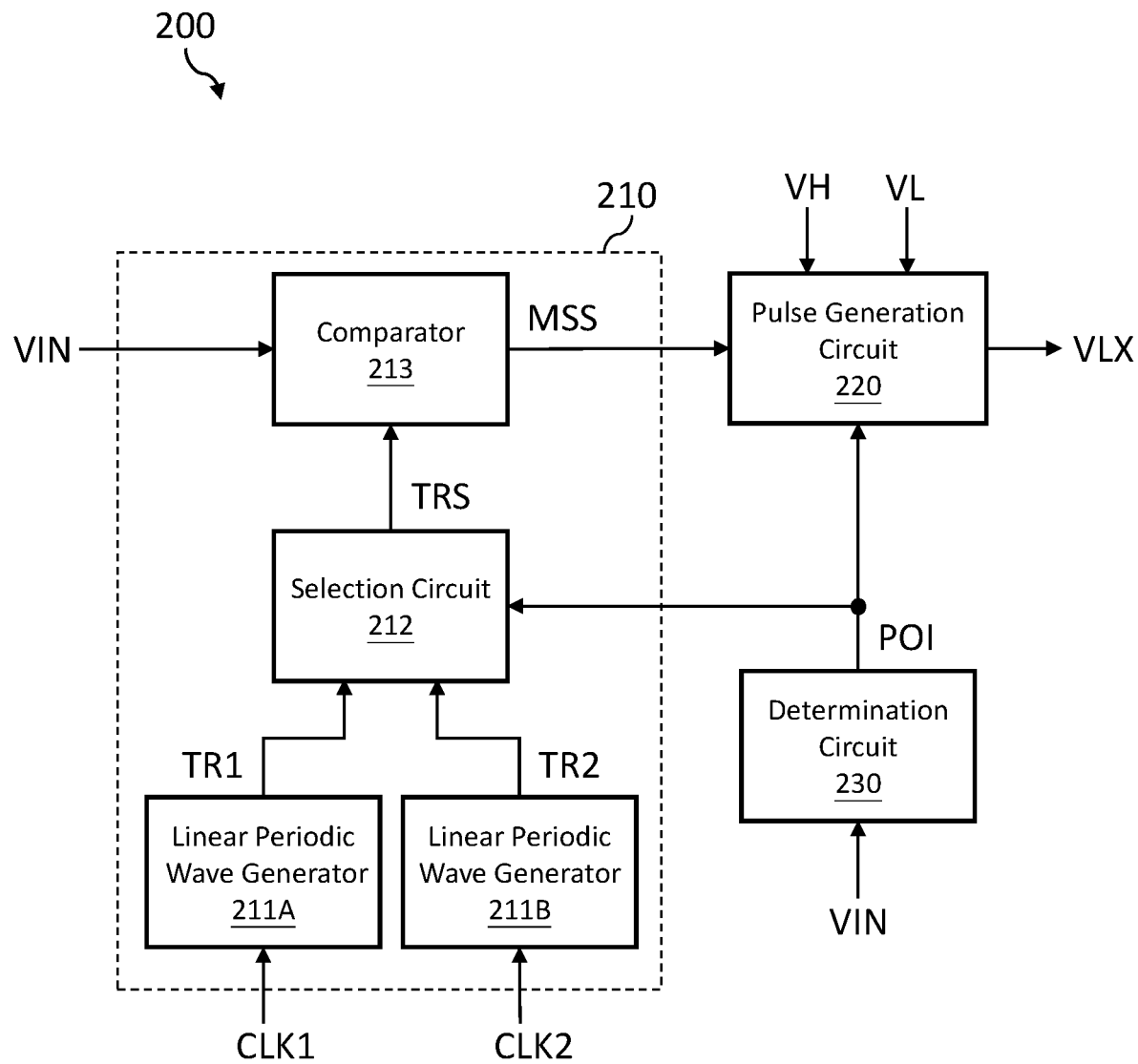
FIG. 5A is a modular block diagram of a class-D amplifier according to another embodiment of the present invention.

Please refer to FIG. 5A. FIG. 5A is a modular block diagram of a class-D amplifier 200 in another embodiment of the present invention. As shown in FIG. 5A, the class-D amplifier 200 includes a PWM circuit 210, a pulse generation circuit 220, and a determination circuit 230, wherein the pulse generation circuit 220 is coupled to the PWM circuit 210 and the determination circuit 230. The structures and functions of the PWM circuit 210, the pulse generation circuit 220, and the determination circuit 230 will be explained in detail below.

In some embodiments, the PWM circuit 210 is configured to generate a selection PWM signal MSS according to an input signal VIN and a selected linear periodic wave TRS, wherein the pulse width modulation circuit 210 selects the first linear periodic wave TR1 or the second linear periodic wave TR2 as the selected linear periodic wave TRS according to the state of the light load indication signal POI. In some embodiments, the PWM circuit 210 includes plural linear periodic wave generators 211A and 211B, a selection circuit 212, and a comparator 213, wherein the linear periodic wave generator 211A is configured to generate the first linear periodic wave TR1 according to the first clock signal CLK1, and the linear periodic wave generator 211B is configured to generate the second linear periodic wave TR2 according to the second clock signal CLK2. The selection circuit 212 is configured to select the first linear periodic wave TR1 or the second linear periodic wave TR2 as the selected linear periodic wave TRS according to the state of the light load indication signal POI. When the light load indication signal POI is in the disabled state (indicating heavy load), the selection circuit 212 selects the first linear periodic wave TR1 as the selected linear periodic wave TRS; when the light load indication signal POI is in the enabled state (indicating light load), the selection circuit 212 selects the second linear periodic wave TR2 as the selected linear periodic wave TRS. The comparator 213 is configured to compare the input signal VIN with the selected linear periodic wave TRS to generate the selection PWM signal MSS. In some embodiments, each of the linear periodic wave generators 211A and 211B is a triangular wave generator or a sawtooth wave generator, and each of the first linear periodic wave TR1 and the second linear periodic wave TR2 is a triangular wave or a sawtooth wave, and the selection circuit 212 is a multiplexer. Multiplexer and comparator are well known circuits to those skilled in the art to which the present invention pertains, and thus they are not explained in detail here.

In some embodiments, the pulse generation circuit 220 is configured to generate the output PWM signal VLX according to the light load indication signal POI, the selection PWM signal MSS, the heavy load supply voltage VH, and the light load supply voltage VL, wherein when the light load indication signal POI is in the disabled state, indicating that the input signal VIN is in a heavy load state, the pulse generation circuit 220 generates an output PWM signal VLX according to the selection PWM signal MSS and the heavy load supply voltage VH. When the light load indication signal POI is in the enabled state, indicating that the input signal VIN is in the light load state, the pulse generation circuit 220 generates the output PWM signal VLX according to the selection PWM signal MSS and the light load supply voltage VL. In some embodiments, the value of the heavy load supply voltage VH is greater than the value of the light load supply voltage VL.

In some embodiments, the determination circuit 230 is configured to determine whether the level of the input signal VIN is less than a light load threshold, wherein the determination circuit 230 generates the light load indication signal POI according to the input signal VIN and the light load threshold. When the level of the input signal VIN is less than the light load threshold, the light load indication signal POI is in the enabled state, indicating that the input signal VIN is in the light load state. When the level of the input signal VIN is greater than the light load threshold, the light load indication signal POI is in the disabled state, indicating that the input signal VIN is in the heavy load state.

Figure 5B:
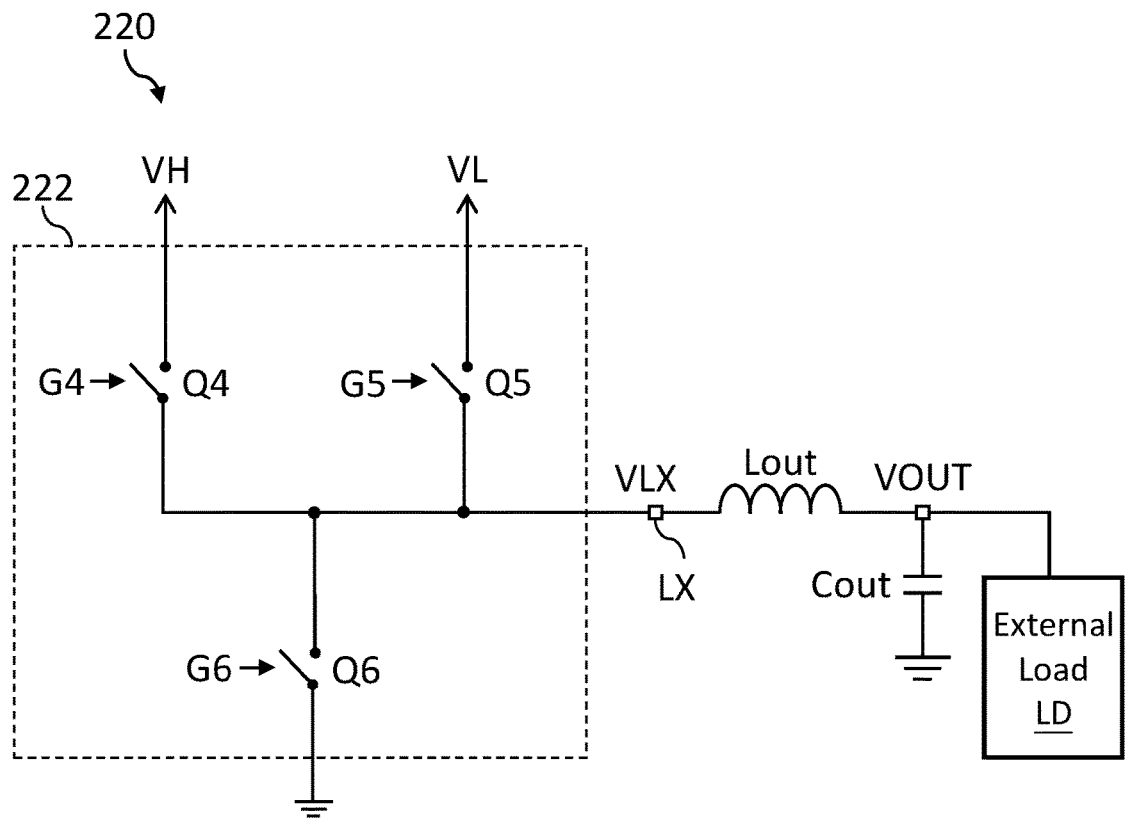
FIG. 5B is a schematic circuit diagram of a pulse generation circuit according to another embodiment of the present invention.
Figure 5B:
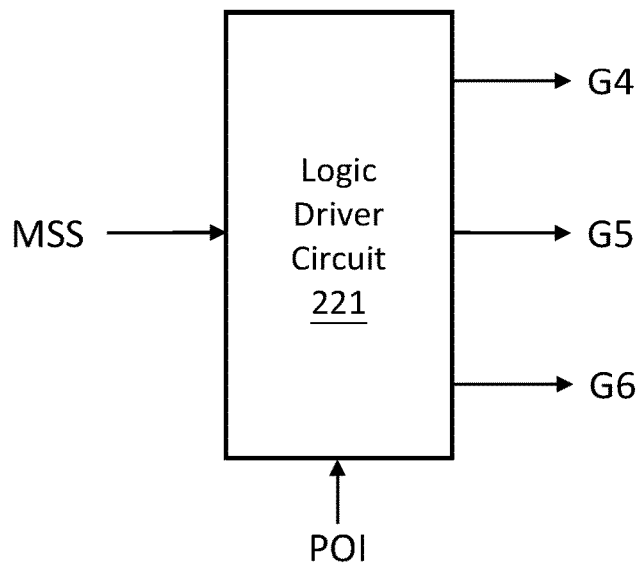

Please refer to FIG. 5B, which is a schematic circuit diagram of the pulse generation circuit 220 according to another embodiment of the present invention. As shown in FIG. 5B, in some embodiments, the pulse generation circuit 220 includes a logic driver circuit 221 and a power stage circuit 222, wherein the logic driver circuit 221 is coupled to the power stage circuit 222. In some embodiments, the logic driver circuit 221 is configured to generate plural control signals G4-G6 according to the light load indication signal POI and the selection PWM signal MSS, so as to control the operation of the power stage circuit 222. The power stage circuit 222 is configured to generate the output PWM signal VLX according to the plural control signals G4-G6. In some embodiments, the power stage circuit 222 is a Y-bridge circuit, wherein the power stage circuit 222 includes plural switches Q4-Q6; the control signal G4 is configured to control the switch Q4; the control signal G5 is configured to control the switch Q5; and the control signal G6 is configured to control the switch Q6. In this embodiment, the switch Q5 is coupled between the light load supply voltage VL and a switching node LX; the switch Q4 is coupled between the heavy load supply voltage VH and the switching node LX; and the switch Q6 is coupled between the switching node LX and a ground potential.

When the light load indication signal POI is in the disabled state, the logic driver circuit 221 will generate the plural control signals G4-G6 according to the selection PWM signal MSS, and the power stage circuit 222 will control the switches Q4-Q6 according to the control signals G4-G6, respectively, so as to generate the output PWM signal VLX at the switching node LX, wherein the switch Q5 is always OFF, and the switch Q4 and the switch Q6 are periodically and complementarily switched between ON and OFF, so that the amplitude of the output PWM signal VLX is equal to the level of the heavy load supply voltage VH. When the light load indication signal POI is in the enabled state, the logic driver circuit 221 generates the plural control signals G4-G6 according to the selection PWM signal MSS, and the power stage circuit 222 will control the switches Q4-Q6 according to the control signals G4-G6, respectively, so as to generate the output PWM signal VLX, wherein the switch Q4 is always OFF, and the switch Q5 and the switch Q6 are periodically and complementarily switched between ON and OFF, so that the amplitude of the output PWM signal VLX is equal to the level of the light load supply voltage VL.

Figure 6:
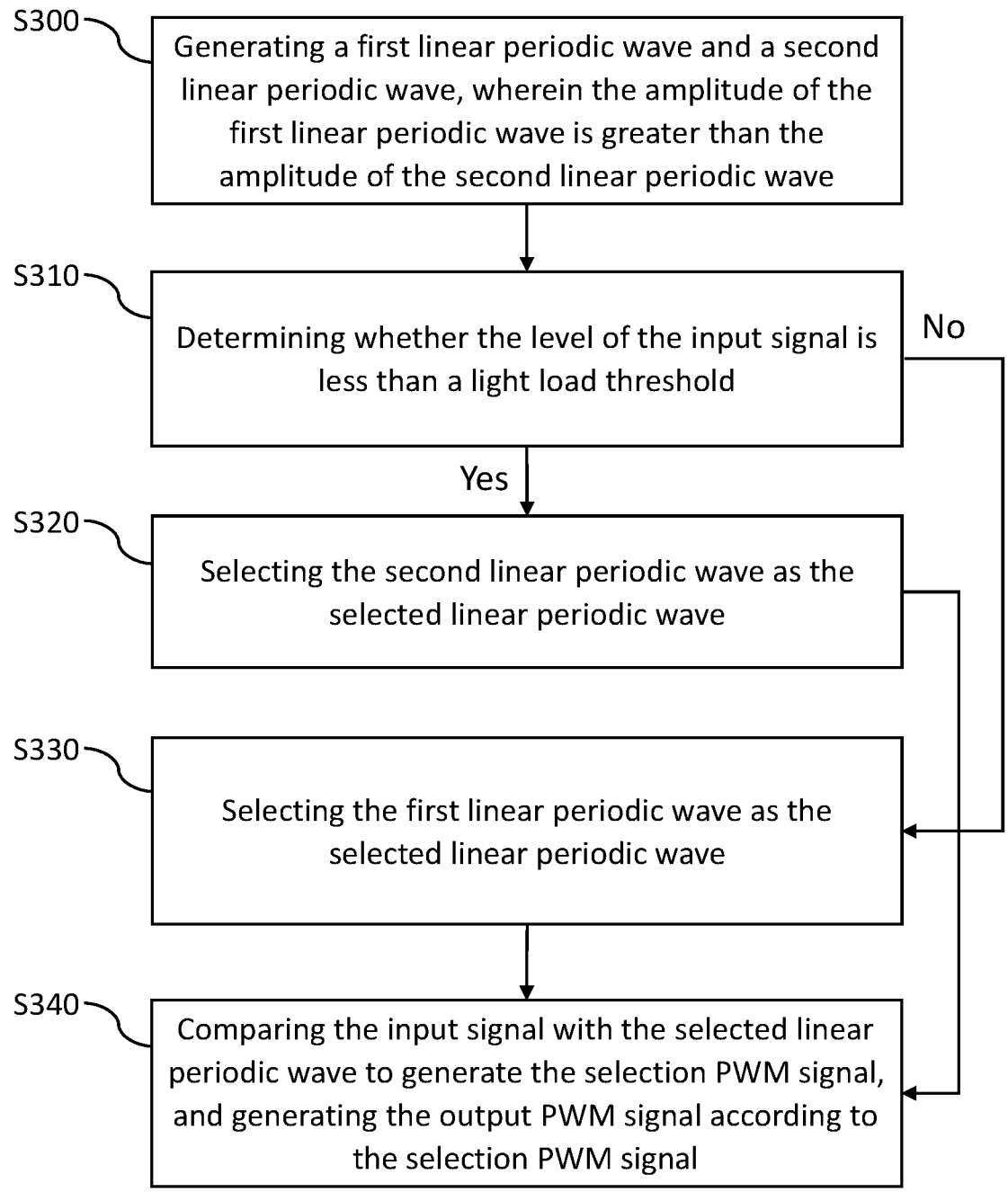
FIG. 6 is a flowchart of a class-D amplifier operating in a PWM method according to another embodiment of the present invention.

Please refer to FIG. 5A and FIG. 6. FIG. 6 is a flow chart of the class-D amplifier 200 operating in the PWM method according to another embodiment of the present invention. As shown in FIG. 6, first, the linear periodic wave generators 211A and 211B of the class-D amplifier 200 generate a first linear periodic wave TR1 and a second linear periodic wave TR2, respectively, wherein the amplitude of the first linear periodic wave TR1 is greater than the amplitude of the second linear periodic wave TR2 (step S300). Next, the determination circuit 230 of the class-D amplifier 200 determines whether the level of the input signal VIN is less than a light load threshold (step S310). If yes, the selection circuit 212 of the class-D amplifier 200 will select the second linear periodic wave TR2 as the selected linear periodic wave TRS (step S320); if not, the selection circuit 212 of the class-D amplifier 200 will select the first linear periodic wave TR1 as the selected linear periodic wave TRS (step S330). Subsequently, the comparator 213 of the class-D amplifier 200 compares the input signal VIN with the selected linear periodic wave TRS to generate the selection PWM signal MSS. Finally, the pulse generation circuit 220 of the class-D amplifier 200 generates the output PWM signal VLX according to the selection PWM signal MSS (step S340).

Figure 7:
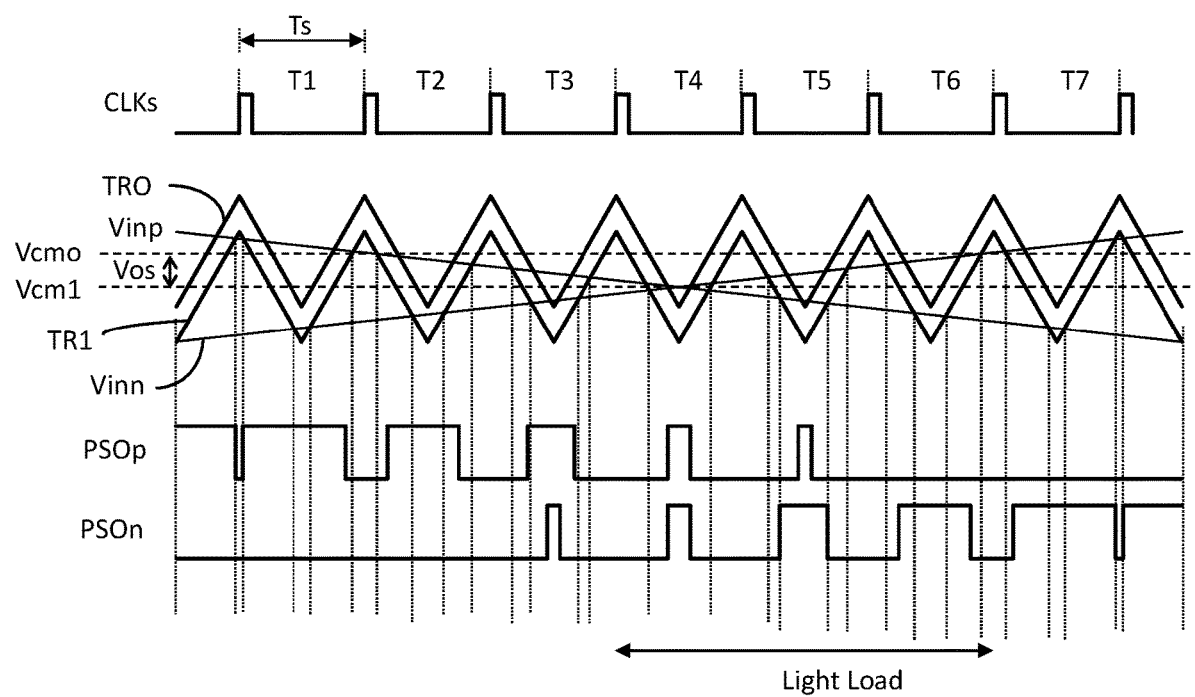
FIG. 7 is a signal waveform diagram of a determination circuit according to an embodiment of the present invention.

Please refer to FIG. 7. FIG. 7 is a signal waveform diagram of the determination circuits 130 and 230 according to an embodiment of the present invention. As shown in FIG. 7, when the determination circuits 130 and 230 determine whether the level of the input signal is less than a light load threshold, the determination circuits 130 and 230 firstly compare an offset linear periodic wave TRO with the input signal (including an in-phase sub-signal Vinp and an inverted-phase sub-signal Vinn which are complementary to each other) to generate an in-phase sub-signal PSOp of the offset PWM signal (corresponding to the in-phase sub-signal Vinp of the input signal) and an inverted-phase sub-signal PSOn of the offset PWM signal (corresponding to the inverted-phase sub-signal Vinn of the input signal), wherein the offset linear periodic wave TRO is obtained by superimposing the first linear periodic wave TR1 with a common mode offset Vos that is not zero, and the common mode offset Vos is relevant to the light load threshold. In this embodiment, the common mode level of the input signal and plural the first linear periodic wave TR1 are the same, which is the first common mode level Vcm1, and the common mode level of the offset linear periodic wave TRO is the offset common mode level Vcmo, wherein the value of the offset common mode level Vcmo is greater than the value of the first common mode level Vcm1 by a common mode offset Vos.

Subsequently, according to an operation period Ts of the offset linear periodic wave TRO, the determination circuits 130 and 230 periodically determines whether the in-phase sub-signal PSOp of the offset PWM signal and the inverted-phase sub-signal PSOn of the offset PWM signal both have a pulse in a previous operation period Ts. If yes, it is determined that the level of the input signal is less than the light load threshold and the light load indication signal POI is enabled; if not, it is determined that the level of the input signal is greater than the light load threshold and the light load indication signal POI is disabled. Taking FIG. 7 as an example, the in-phase sub-signal PSOp of the offset PWM signal and the inverted-phase sub-signal PSOn of the offset PWM signal both have a pulse during the operation periods T3-T5, so the light load indication signal POI is enabled during the operation periods T4-T6.

Figure 8:
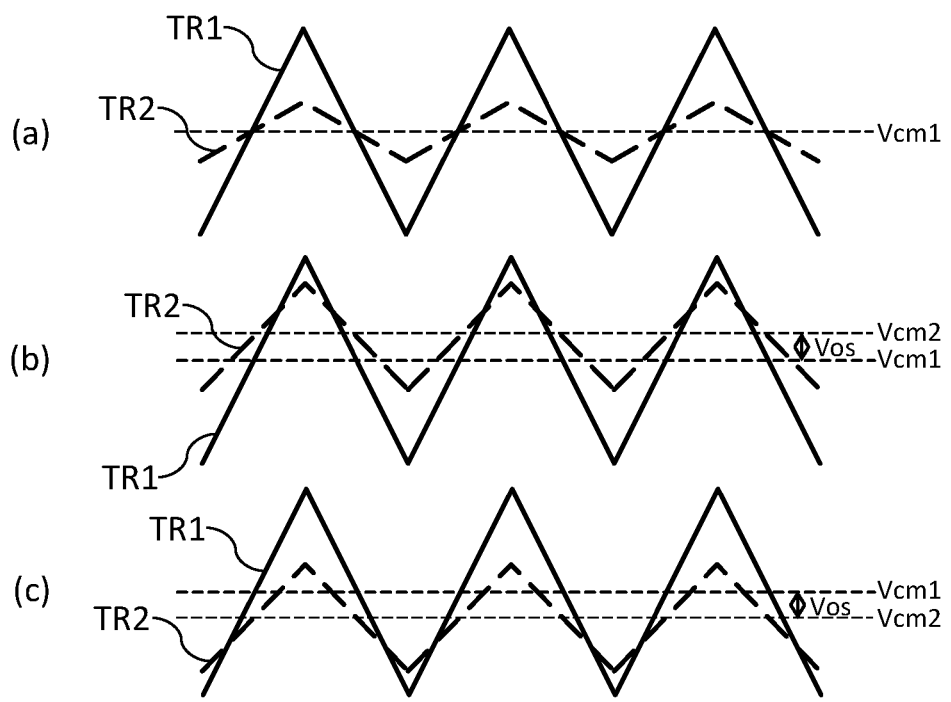
FIG. 8 is a waveform comparison diagram of a first linear periodic wave and a second linear periodic wave according to some embodiments of the present invention.

Please refer to FIG. 8. FIG. 8 is a waveform comparison diagram of the first linear periodic wave TR1 and the second linear periodic wave TR2 according to some embodiments of the present invention, wherein the common mode level of the first linear periodic wave TR1 is the first common mode level Vcm1, and the first common mode level Vcm1 is also the common mode level of the input signal. In this embodiment, while the input signal is zero (AC amplitude is zero), the duty cycle of the first relay PWM signal MS1 which is generated according to the first linear periodic wave TR1, is 50%. As shown in (a) of FIG. 8, in this embodiment, the common mode level of the second linear periodic wave TR2 is the first common mode level Vcm1, so that duty cycle of the second relay PWM signal MS2 generated according to the second linear periodic wave TR2 during idle condition, i.e., while the input signal is zero (AC amplitude is zero), is 50%. In some embodiments, the common mode level of the second linear periodic wave TR2 is the second common mode level Vcm2, and there is a common mode offset Vos that is not zero between the second common mode level Vcm2 and the common mode level of the input signal VIN. As shown in (b) of FIG. 8, in this embodiment, the common mode offset Vos is a positive value, so the duty cycle of the second relay PWM signal MS2 generated according to the second linear periodic wave TR2 during idle condition, i.e., while the input signal is zero (AC amplitude is zero), is less than 50%. As shown in (c) of FIG. 8, in this embodiment, the common mode offset Vos is a negative value, so the duty cycle of the second relay PWM signal MS2 generated according to the second linear periodic wave TR2 during idle condition, i.e., while the input signal is zero (AC amplitude is zero), is greater than 50%.

Figure 9:
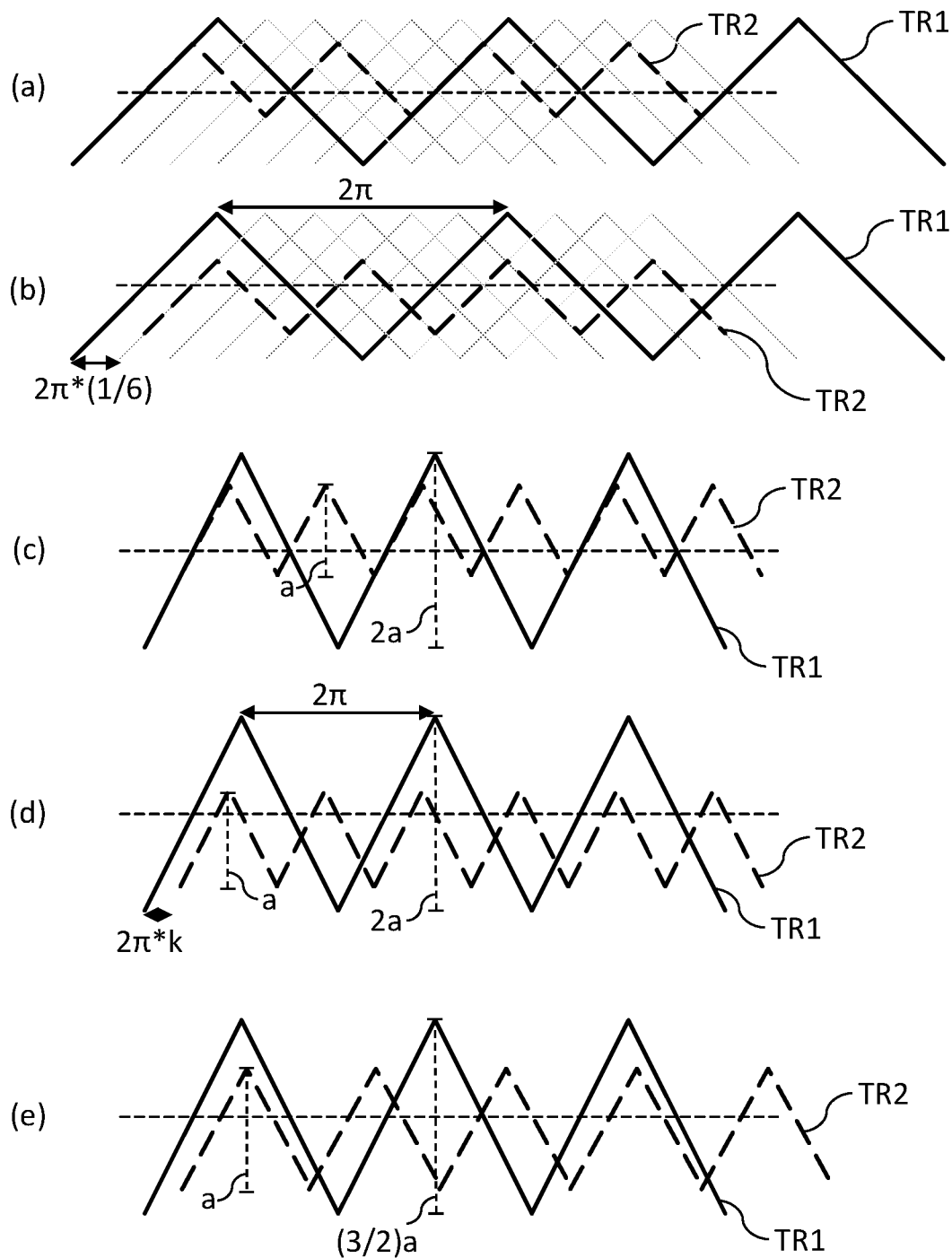
FIG. 9 is a waveform comparison diagram of the first linear periodic wave and the second linear periodic wave according to other embodiments of the present invention.

Please refer to FIG. 9. FIG. 9 is a waveform comparison diagram of the first linear periodic wave TR1 and the second linear periodic wave TR2 in other embodiments of the present invention. In some embodiments, the frequency of the second linear periodic wave TR2 is X times the frequency of the first linear periodic wave TR1, wherein X is a rational number greater than or equal to one. As shown in (a)-(d) of FIG. 9, in some embodiments, the frequency of the second linear periodic wave TR2 is twice the frequency of the first linear periodic wave TR1. As shown in (e) of FIG. 9, in this embodiment, the frequency of the second linear periodic wave TR2 is 3/2 times the frequency of the first linear periodic wave TR1.

In some embodiments, the first linear periodic wave TR1 and the second linear periodic wave TR2 have a predetermined phase difference which is not zero. As shown in (b) of FIG. 9, in this embodiment, the predetermined phase difference between the first linear periodic wave TR1 and the second linear periodic wave TR2 is $2\pi*(\frac{1}{8})$. As shown in (d) of FIG. 9, in this embodiment, the predetermined phase difference between the first linear periodic wave TR1 and the second linear periodic wave TR2 is $2\pi*k$, wherein k is a rational number.

In some embodiments, the amplitude of the first linear periodic wave TR1 is Y times the amplitude of the second linear periodic wave TR2, wherein Y is a non-integer greater than one. As shown in (a)-(d) of FIG. 9, in these embodiments, the amplitude of the first linear periodic wave TR1 is twice the amplitude of the second linear periodic wave TR2. As shown in (e) of FIG. 9, in this embodiment, the amplitude of the first linear periodic wave TR1 is 3/2 times the amplitude of the second linear periodic wave TR2.

Figure 10:
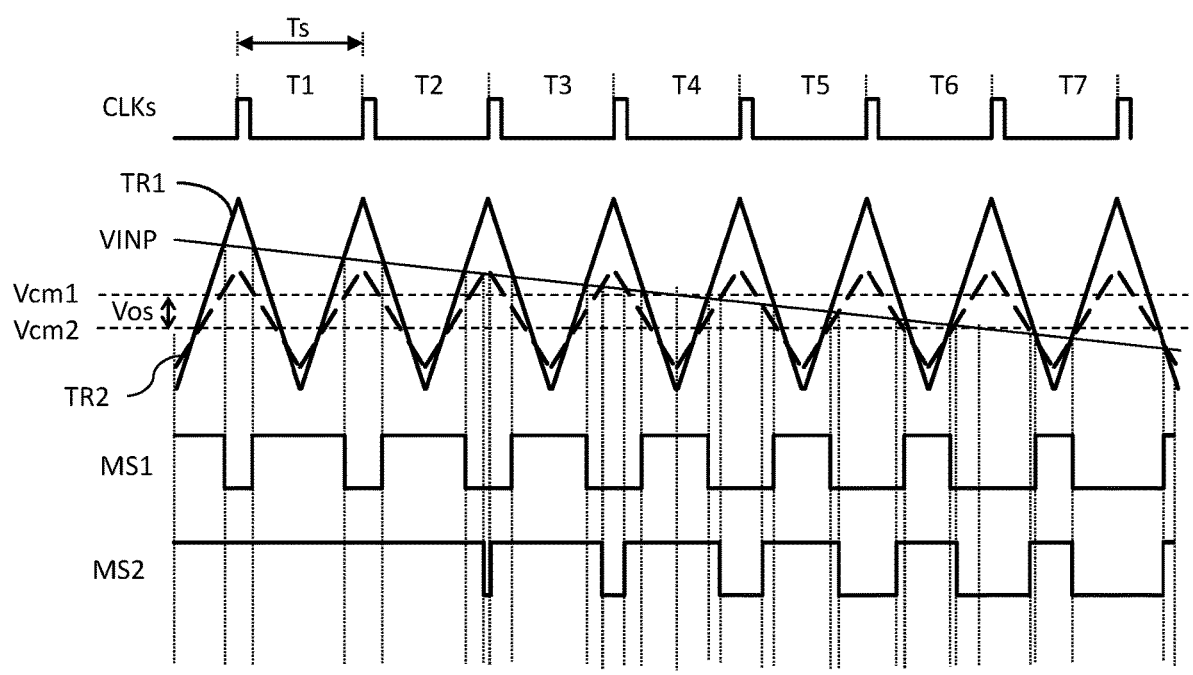
FIG. 10 is a signal waveform diagram of a PWM circuit according to another embodiment of the present invention.

Please refer to FIG. 10. FIG. 10 is a signal waveform diagram of the PWM circuits 110A and 110B according to an embodiment of the present invention, wherein the first linear periodic wave TR1 and the second linear periodic wave TR2 of this embodiment correspond to the triangular wave signals in (c) of FIG. 8. The PWM circuit 110A generates the first relay PWM signal MS1 according to the input signal VINP and the first linear periodic wave TR1, and the PWM circuit 110B generates the second relay PWM signal MS2 according to the input signal VINP and the second linear periodic wave TR2, wherein the duty cycle of the first relay PWM signal MS1 is 50% during idle condition. As shown in FIG. 10, the common mode level of the input signal VINP and the common mode level of the first linear periodic wave TR1 is the first common mode level Vcm1, and the common mode level of the second linear periodic wave TR2 is the second common mode level Vcm2, wherein the difference between the first common mode level Vcm1 and the second common mode level Vcm2 is the common mode offset Vos, and the common mode offset Vos is relevant to the light load threshold. In this embodiment, since the common mode offset Vos is a negative value, the duty cycle of the second relay PWM signal MS2 generated according to the second linear periodic wave TR2 during idle condition is greater than 50% (as shown in period T4).

Figure 11A:
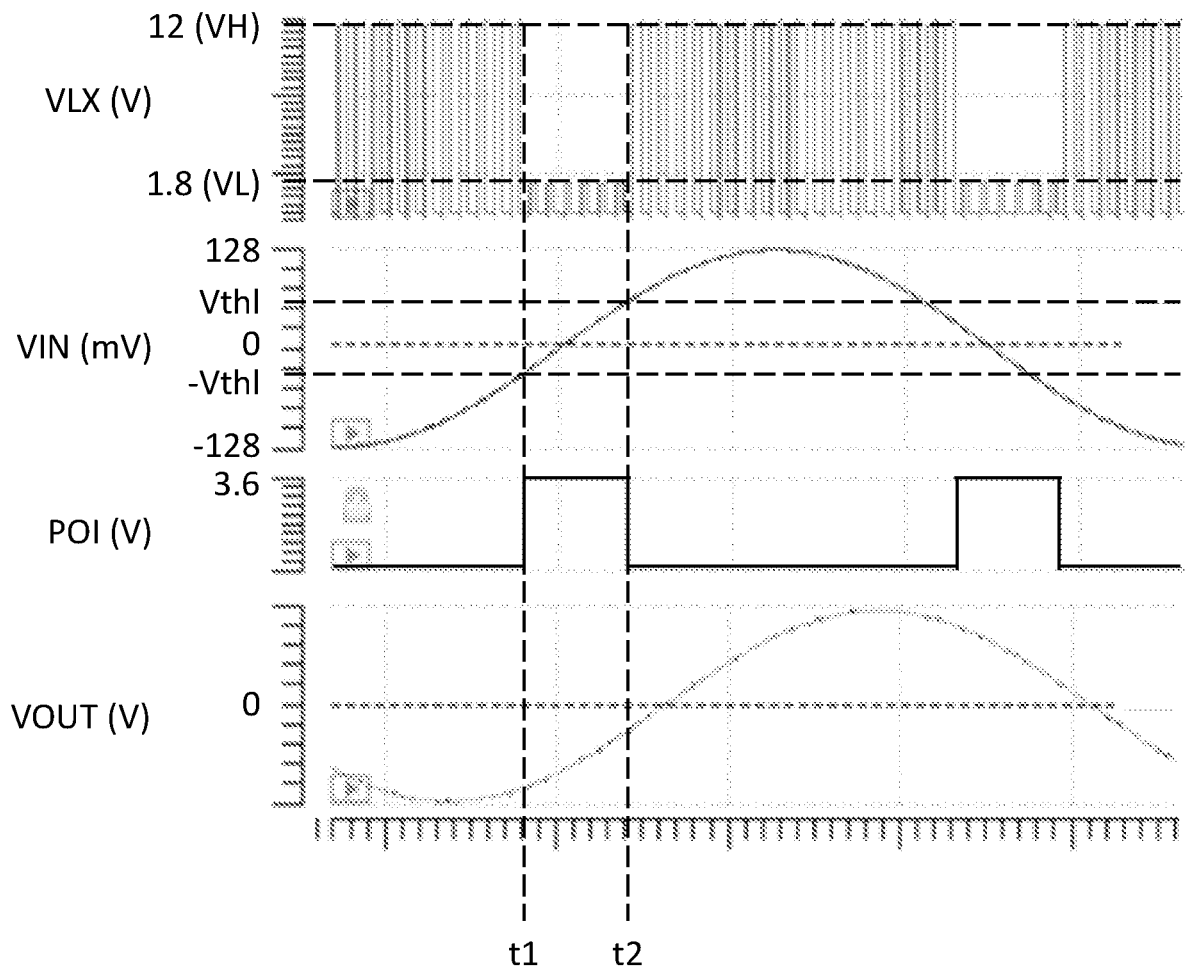
FIG. 11A is a signal waveform diagram (1) of a class-D amplifier according to an embodiment of the present invention.
Figure 11B:
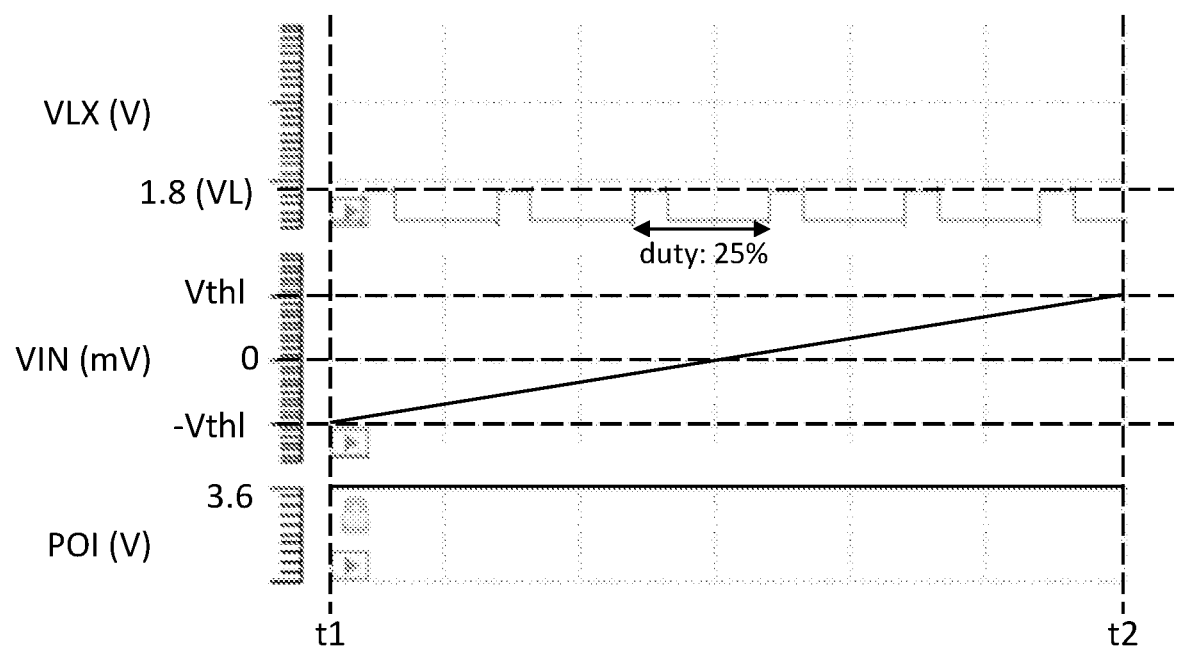
FIG. 11B is a signal waveform diagram (2) of a class-D amplifier according to an embodiment of the present invention.

Please refer to FIGS. 11A and 11B. FIGS. 11A and 11B are signal waveform diagrams of the class-D amplifiers 100 and 200 according to an embodiment of the present invention, wherein FIG. 11B is a zoom-in view of FIG. 11A. As shown in FIG. 11A, when the level of the input signal VIN is less than the light load threshold Vth1, the input signal VIN is in the light load state and the light load indication signal POI is in the enabled state (in this embodiment, the enabled state is a high potential state). Under such circumstance, the amplitude of the output PWM signal VLX is the value of the light load supply voltage VL, that is, the output PWM signal VLX is switched between the light load supply voltage VL and zero. When the level of the input signal VIN is greater than the light load threshold Vth1, the input signal VIN is in a heavy load state and the light load indication signal POI is in the disabled state (in this embodiment, the disabled state is a low potential state), the amplitude of the output PWM signal VLX is the value of the heavy load supply voltage VH, that is, the output PWM signal VLX is switched between the heavy load supply voltage VH and zero. The output signal VOUT is the waveform of the output PWM signal VLX filtered by the output inductor Lout and the output capacitor Cout. As shown in FIG. 11B, in some embodiments, when the value of the input signal VIN is zero, the duty cycle of the output PWM signal VLX is not 50%. In this embodiment, when the value of the input signal VIN is zero, the duty cycle of the output PWM signal VLX is 25%.

In some embodiments, the amplitude of the output PWM signal VLX while the level of the input signal VIN is greater than the light load threshold Vth1 is greater than the amplitude of the output PWM signal VLX while the level of the input signal VIN is less than the light load threshold Vth1. In other embodiments, the amplitude of the output PWM signal VLX while the level of the input signal is greater than the light load threshold Vth1 (such output PWM signal VLX will be referred to as heavy load pulse width signal hereinafter) is Z times the amplitude of the output PWM signal VLX while the level of the input signal is less than the light load threshold Vth1 (such output PWM signal VLX will be referred to as the light load pulse width signal hereinafter), wherein Z is a non-integer greater than one. Taking FIG. 11A as an example, the amplitude of the heavy load pulse width signal is equal to the level of the heavy load supply voltage VH, for example, 12 volts, and the amplitude of the light load pulse width signal is equal to the level of the light load supply voltage VL, for example, 1.8 volts. Therefore, the amplitude of the heavy load pulse width signal is greater than the amplitude of the light load pulse width signal, and the amplitude of the heavy load pulse width signal is 20/3 times the amplitude of the light load pulse width signal.

To sum up, the PWM method of the present invention generates relay PWM signals with different duty cycles by adjusting, for example but not limited to, the common mode offset of the linear periodic wave, thereby generating an adaptive output PWM signal having a duty cycle which is not equal to 50% during idle condition, whereby the current consumed in the idle condition is smaller to thereby reduce the power consumption. Furthermore, the PWM method of the present invention also can adaptively adjust the switching frequency and the amplitude of the output PWM signal, so that the switching frequency of the output PWM signal can be adaptively adjusted under light load and heavy load conditions, such as increasing the switching frequency or reducing the amplitude under light load condition to reduce ripple current, or reducing the switching frequency or increasing the amplitude under heavy load to reduce power loss, thereby improving conversion efficiency.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A pulse width modulation (PWM) method, which is configured to convert an input signal into a corresponding output PWM signal, the PWM method comprising:
    generating a first linear periodic wave and a second linear periodic wave, wherein an amplitude of the first linear periodic wave is greater than an amplitude of the second linear periodic wave, wherein each of the first linear periodic wave and the second linear periodic wave is a triangular wave or a sawtooth wave;
    determining whether a level of the input signal is less than a light load threshold,
    when the level of the input signal is less than the light load threshold, generating the output PWM signal according to a comparison between the input signal and the second linear periodic wave; and
    when the level of the input signal is greater than the light load threshold, generating the output PWM signal according to a comparison between the input signal and the first linear periodic wave;
    wherein there is a common mode non-zero offset between a common mode level of the second linear periodic wave and a common mode level of the input signal, so that a root mean square (RMS) power of the output PWM signal when the level of the input signal is less than the light load threshold is less than a RMS power of the output PWM signal when the common mode offset is zero.

2. The PWM method of claim 1, further comprising:
    comparing the input signal with the first linear periodic wave to generate a first relay PWM signal, and comparing the input signal with the second linear periodic wave to generate a second relay PWM signal;
    when the level of the input signal is less than the light load threshold, generating the output PWM signal according to the second relay PWM signal; and
    when the level of the input signal is greater than the light load threshold, generating the output PWM signal according to the first relay PWM signal.

3. The PWM method of claim 1, further comprising:
    when the level of the input signal is greater than the light load threshold, selecting the first linear periodic wave as a selected linear periodic wave;
    when the level of the input signal is less than the light load threshold, selecting the second linear periodic wave as the selected linear periodic wave; and
    comparing the input signal with the selected linear periodic wave to generate a selection PWM signal, and generating the output PWM signal according to the selection PWM signal.

4. The PWM method of claim 1, wherein when a value of the input signal is zero, a duty cycle of the output PWM signal is not 50%.

5. The PWM method of claim 1, wherein a frequency of the second linear periodic wave is X times a frequency of the first linear periodic wave, wherein X is a rational number greater than or equal to one.

6. The PWM method of claim 5, wherein X is a non-integer greater than one.

7. The PWM method of claim 1, wherein a predetermined phase difference other than zero exists between the first linear periodic wave and the second linear periodic wave.

8. The PWM method of claim 7, wherein the predetermined phase difference is a product of 2n multiplied by a rational number.

9. The PWM method of claim 1, wherein the amplitude of the first linear periodic wave is Y times the amplitude of the second linear periodic wave, wherein Y is a non-integer greater than one.

10. The PWM method of claim 1, wherein the amplitude of the output PWM signal while the level of the input signal is greater than the light load threshold is greater than the amplitude of the output PWM signal while the level of the input signal is less than the light load threshold.

11. The PWM method of claim 10, wherein the PWM method is configured to control a power stage circuit to generate the output PWM signal, wherein the power stage circuit comprises a plurality of switches, and the plurality of switches comprises a first switch, a second switch, and a third switch, the first switch being coupled between a light load supply voltage and a switching node; the second switch being coupled between a heavy load supply voltage and the switching node; and the third switch being coupled between the switching node and a ground potential, wherein the heavy load supply voltage is greater than the light load supply voltage; wherein:
    when the level of the input signal is less than the light load threshold, the power stage circuit controls the first switch and the third switch to periodically switch complementarily to generate the output PWM signal at the switching node according to the comparison between the input signal and the second linear periodic wave, wherein the output PWM signal is switched between the light load supply voltage and the ground potential; and
    when the level of the input signal is greater than the light load threshold, the power stage circuit controls the second switch and the third switch to periodically switch complementarily to generate the output PWM signal at the switching node according to according to the comparison between the input signal and the first linear periodic wave, wherein the output PWM signal is switched between the heavy load supply voltage and the ground potential.

12. The PWM method of claim 1, wherein the amplitude of the output PWM signal while the level of the input signal is greater than the light load threshold is Z times the amplitude of the output PWM signal while the level of the input signal is less than the light load threshold, wherein Z is a non-integer greater than one.

13. The PWM method of claim 1, wherein the step of determining whether the level of the input signal is less than the light load threshold comprises:
    comparing an offset linear periodic wave with the input signal to generate an offset PWM signal, wherein the offset linear periodic wave is obtained by superimposing the first linear periodic wave with a common mode offset that is not zero, the common mode offset that is not zero is relevant to the light load threshold; and
    according to an operation period of the offset linear periodic wave, periodically determining whether an in-phase sub-signal of the offset PWM signal and an inverted-phase sub-signal of the offset PWM signal both have a pulse in a previous operation period, and determining whether the level of the input signal is less than the light load threshold;
    wherein the in-phase sub-signal of the input signal and the inverted-phase sub-signal of the input signal are complementary to each other, the in-phase sub-signal of the offset PWM signal being obtained by comparing the offset linear periodic wave with the in-phase sub-signal of the input signal, and the inverted-phase sub-signal of the offset PWM signal being obtained by comparing the offset linear periodic wave with the inverted-phase sub-signal of the input signal.

* * * * *